United States Patent
Hunter et al.

(10) Patent No.: US 11,418,181 B2
(45) Date of Patent: Aug. 16, 2022

(54) SWITCH TURN-OFF CIRCUIT

(71) Applicant: TEXAS INSTRUMENTS INCORPORATED, Dallas, TX (US)

(72) Inventors: Bradford Lawrence Hunter, Spicewood, TX (US); Karthik Nandimandalam Venkata, Dallas, TX (US); Quanqing Hu, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 224 days.

(21) Appl. No.: 16/279,642

(22) Filed: Feb. 19, 2019

(65) Prior Publication Data

US 2020/0266813 A1     Aug. 20, 2020

(51) Int. Cl.
| | | |
|---|---|---|
| *H03K 17/0812* | (2006.01) | |
| *H02J 7/00* | (2006.01) | |
| *H02H 9/04* | (2006.01) | |
| *H02H 1/00* | (2006.01) | |
| *H02M 1/08* | (2006.01) | |

(52) U.S. Cl.
CPC ..... *H03K 17/08122* (2013.01); *H02H 1/0007* (2013.01); *H02H 9/045* (2013.01); *H02J 7/0031* (2013.01); *H02M 1/08* (2013.01); *H02J 7/00304* (2020.01)

(58) Field of Classification Search
CPC ............ H02J 7/0031; H03K 17/08104; H03K 17/08122; H03K 17/08142; H03K 17/0822; H03K 17/0812–08128; H02H 9/02; H02H 9/025
See application file for complete search history.

(56) References Cited

U.S. PATENT DOCUMENTS

| | | | | |
|---|---|---|---|---|
| 7,342,328 B1* | 3/2008 | Eddleman | ................ | H02J 1/10 307/80 |
| 2008/0205100 A1* | 8/2008 | Sakamoto | ............... | H02M 3/07 363/67 |
| 2015/0372678 A1* | 12/2015 | Zhang | ................ | H03K 17/0822 327/109 |
| 2018/0026458 A1* | 1/2018 | Kawamura | ............. | B60L 58/10 320/135 |
| 2018/0205220 A1* | 7/2018 | Elliott | ...................... | H02H 3/05 |

FOREIGN PATENT DOCUMENTS

DE     3842169 A1 *  6/1990   ............... H02H 5/10

* cited by examiner

*Primary Examiner* — Jared Fureman
*Assistant Examiner* — Christopher J Clark
(74) *Attorney, Agent, or Firm* — Michelle F. Murray; Charles A. Brill; Frank D. Cimino

(57) ABSTRACT

Aspects of the present disclosure provide for a circuit comprising a switch coupled between a first node and a second node, a first transistor having a gate terminal, a drain terminal coupled to the second node, and a source terminal coupled to a ground terminal, a logic gate having a first input, a second input coupled to a third node, and an output coupled to the gate terminal of the first transistor, and a comparator having a first input coupled to the second node, a second input coupled to a fourth node, and an output coupled to the first input of the logic gate.

19 Claims, 3 Drawing Sheets

SWITCH TURN-OFF CIRCUIT

BACKGROUND

In some electrical devices, a power switch such as a transistor electrically couples a power source to a load. The power source can be a battery or mains power, such as via an adapter and/or converter. Characteristics of the load can sometimes affect the power switch, the power source, or other related devices. For example, when the load draws an excessive amount of current, such as when the load becomes damaged, experiences a short condition, or other various events occur, damage to the power switch, the power source, or the other related devices can occur.

SUMMARY

Aspects of the present disclosure provide for a circuit. In some examples, the circuit comprises a switch coupled between a first node and a second node, a first transistor having a gate terminal, a drain terminal coupled to the second node, and a source terminal coupled to a ground terminal, a logic gate having a first input, a second input coupled to a third node, and an output coupled to the gate terminal of the first transistor, and a comparator having a first input coupled to the second node, a second input coupled to a fourth node, and an output coupled to the first input of the logic gate.

Other aspects of the present disclosure provide for a system. In some examples, the system comprises a battery coupled to a first node, a load coupled to a second node, a first n-type field-effect transistor (FET) (nFET) having a gate terminal coupled to a third node, a drain terminal coupled to the first node and a source terminal coupled to the second node, turn-off circuitry coupled to the gate terminal of the first nFET and configured to turn off the first nFET when a fault occurs in the system, and a controller coupled to the turn-off circuitry and configured to detect the fault in the system and control the turn-off circuitry based on the fault occurring in the system.

Other aspects of the present disclosure provide for a circuit. In some examples, the circuit comprises a first nFET configured to switch power from a battery to a load based on a value of a bias signal, a comparator configured to compare the bias signal to a signal representative of an output of the circuit, a logic circuit coupled to the comparator and configured to perform a logical AND operation between an output of the comparator and a pre-emphasis signal asserted when a fault condition occurs with the battery or the load, and a second nFET coupled to the logic circuit and configured to discharge the bias signal to a ground terminal when the logic circuit outputs a logical high signal to electrically decouple the battery from the load.

BRIEF DESCRIPTION OF THE DRAWINGS

For a detailed description of various examples, reference will now be made to the accompanying drawings in which.

DETAILED DESCRIPTION

Figure 1:
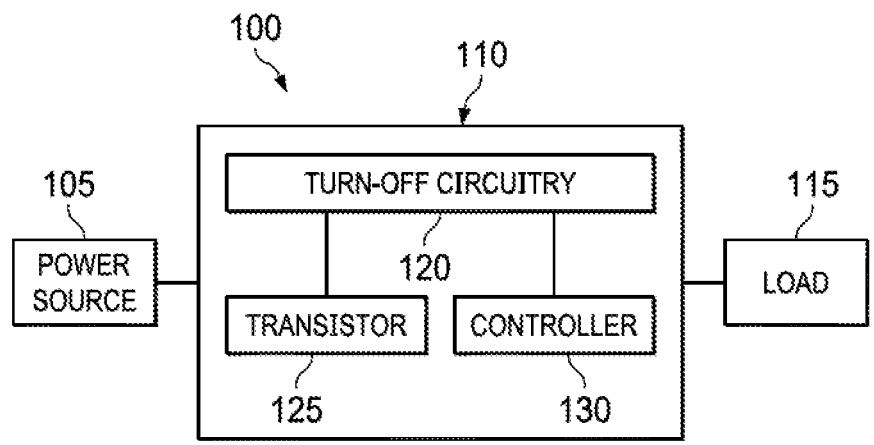
FIG. 1 shows a block diagram of an illustrative system in accordance with various examples.

In various electronic devices, it may be desirable to rapidly control a switching device (e.g., such as a transistor) to rapidly turn off. When the switching device is electrically positioned in series between a power source and a load, under certain circumstances it may be desirable to rapidly electrically decouple the load from the power source. For example, when the load experiences a short condition, or the power source experiences an over-current condition, it may be desirable to rapidly decouple the load from the power source to protect the load, the power source, and/or other associated circuitry (e.g., a power converter, controller, or other related circuitry in series and/or parallel with a power path from the power source to the load) from damage and/or destruction. In at least some examples, the damage, and/or the conditions leading to the damage, can have further consequences such as creating a fire (e.g., at the power source, the load, or another associated circuit or component) or other unsafe condition for a user.

Simply turning off the switching device to electrically decouple the load from the power source in itself may be, in some examples, insufficient to protect the switching device, the power source, the load, and/or the other associated circuitry from damage. In some examples, the switching device is a transistor, such as a field effect transistor (FET) operating as a high-side transistor of a power converter configured to provide power to the load. When the transistor is operating as a switch that is fully "turned-on" or fully biased, the transistor operates in a linear region of operation. In the linear region of operation, a voltage differential between the drain terminal and source terminal of the transistor is comparatively low, and therefore power consumed by the transistor (defined as the voltage drop of the transistor, such as the voltage differential between the drain terminal and the source terminal, multiplied by a current flowing through the transistor), is comparatively small. However, when the transistor is less than fully turned-on, such as when the transistor is being turned off and/or turned on, the transistor momentarily operates in a saturation region of operation until voltages present at the drain and source terminals of the transistor equalize during turn-on, or until the transistor is fully turned off. In the saturation region of operation, a voltage differential between the drain terminal and source terminal of the transistor increases greatly (e.g., the drain terminal of the transistor remains at a value substantially equal to that of the power source and the source terminal of the transistor has a voltage value approaching zero as the transistor turns off). When an over-current condition of the power source or a short condition of the load occurs, the transistor can be subjected to large amounts of power flowing between drain and source terminals of the transistor. For example, when the short or over-voltage condition occurs, an amount of current approximately equal to a maximum current rating of the transistor is dropped across the transistor and the transistor dissipates the current as heat. However, when combined with the large voltage differential between the source and drain terminals of the transistor while the transistor operating in the saturation region of operation, a large amount of power is created that is dissipated as heat that can partially or fully melt the transistor, degrading and/or permanently destroying the transistor.

Aspects of the present disclosure provide for a circuit configured to rapidly control a switching device. In at least some examples, the circuit is a rapid turn-off circuit for controlling a n-type FET (nFET), such as a nFET of a power converter (e.g., buck converter, boost converter, and/or buck-boost converter) configured to provide power from a power source to a load. In some examples, rapidly turning-off the nFET protects the power source and/or the load from damage and/or destruction. In at least some examples, rapidly turning-off the nFET further protects a user of the circuit (e.g., such as a user of a system in which the circuit is implemented) from being exposed to unsafe conditions resulting at least partially from the over-current or short condition.

In at least some examples, the circuit is configured to bias a transistor with a value sufficient to fully turn-on the transistor during normal operation of a system (e.g., when the system is not experiencing an over-current or short condition). The circuit is further configured to rapidly turn-off the transistor when the over-current or short condition occurs. For example, when the transistor is a nFET, the nFET is biased at a gate terminal of the nFET with a bias signal (sometimes referred to as a gate signal) having a voltage value greater than a voltage value of signals that will be present at source or drain terminals of the nFET. When the over-current or short condition occurs, a source of the bias signal is decoupled from the gate terminal of the nFET and the gate terminal of the nFET is coupled to a ground terminal to discharge any remaining charge present at the gate terminal of the nFET. In some examples, a second transistor at least partially controlled by a comparator performs the coupling of the gate terminal of the nFET to the ground terminal.

The comparator is, in some examples, a high-speed comparator that compares a value of the bias signal to a value of a signal representative of an output voltage (Vout) of the circuit, such as a signal provided to the load. In some examples, the signal representative of Vout is Vout itself, while in other examples the signal representative of Vout is modified by one or more components before reaching the comparator. For example, in at least one example, an output resistor is placed in series between an output terminal of the circuit and an input of the comparator such that at least a portion of Vout drops across the output resistor prior to reaching the input of the comparator. When the comparator determines that the value of the bias signal is greater than the value of the signal representative of Vout, the comparator outputs a logical high signal and when the value of the bias signal is less than the value of the signal representative of Vout, the comparator outputs a logical low signal. The output of the comparator is combined in a logical AND operation with a pre-emphasis signal and an output of that logical AND operation drives a gate terminal of the second transistor to control the second transistor discharging, or not discharging, the gate terminal of the nFET to the ground terminal. In at least some examples, the logical AND operation is performed by a digital logic AND gate, while in other examples the logical AND operation is performed by any other suitable analog and/or digital circuitry or circuit components.

In some examples, a voltage divider is coupled to the nFET such that a first resistor of the voltage divider is coupled in series between the gate terminal of the nFET and the second transistor and a second resistor of the voltage divider is coupled between the gate terminal of the nFET and the source terminal of the nFET. In at least some examples, by varying a resistance of the first resistor while a resistance of the second resistor remains unchanged, an amount of time for turning off the nFET is programmable. For example, by decreasing resistance of the first resistor, the amount of time for turning off the nFET decreases until the amount of time for turning off the nFET reaches a minimum when the resistance of the first resistor reaches a minimum. Similarly, by increasing resistance of the first resistor, the amount of time for turning off the nFET increases.

Turning now to FIG. 1, an illustrative system 100 is shown. In at least some examples, the system 100 is representative of an electronic device such as a laptop computer, a notebook computer, a netbook computer, a tablet device, a smartphone, a wearable device (e.g., smart watch, smart glasses, etc.), a power tool, or any other electronic device in which power is provided to a load via a switching device. In an example architecture, the system 100 includes, or is configured to couple to, a power source 105. The power source 105 is, in some examples, a single-cell or multi-cell battery. In other examples, the power source 105 is an external power supply. The system 100 further includes a circuit 110 and a load 115.

The circuit 110, in some examples, includes turn-off circuitry 120 that controls a transistor 125 to provide rapid turn-off functionality for the transistor 125 and a controller 130 that monitors the load 115 and/or the power source 105 for faults, including at least short conditions and/or over-current conditions, and provides one or more controls signals to the turn-off circuitry 120 when a fault occurs. For example, the turn-off circuitry 120 includes a first terminal coupled to a terminal of the transistor 125 (e.g., such as a gate terminal of the transistor 125) and one or more additional terminals coupled to output(s) of the controller 130 (e.g., such that the controller 130 exerts some level of control over the turn-off circuitry based on signals provided by the controller 130 to the turn-off circuitry 120 via the one or more additional terminals). Additionally, although not shown, in at least some examples the turn-off circuitry 120, the transistor 125, and/or the controller 130 have terminals coupled to the power source 105, such as to receive power from the power source 105. In at least some examples, the circuit 110 further includes other circuitry (not shown) such as a power converter and/or any other suitable components associated with conversion and/or providing of power (e.g., such as a regulated power signal) from the power source 105 to the load 115. In some examples, the transistor 125 is a component of the turn-off circuitry 120, while in other examples the transistor 125 is a component of the other circuitry, such as a high-side power transistor of a power converter that modifies (e.g., increases and/or decreases) a value of an output signal of the power source 105 before providing the modified signal as Vout of the circuit 110 to the load 115.

In at least one example of operation, the turn-off circuitry 120 monitors a value of a bias signal (Vbias) with respect to a value of a signal representative of Vout of the circuit 110 to determine whether the value of the bias signal exceeds the value of the signal representative of Vout. When the value of Vbias does not exceed the value representative of Vout, the turn-off circuitry 120 controls the transistor 125 to operate in a linear region of operation and be fully turned-on, conducting current between its source and drain terminals. When the value of Vbias exceeds the value representative of Vout, the turn-off circuitry 120 controls the transistor 125 to rapidly turn off, ceasing conduction of current between the source and drain terminals of the transistor 125 (e.g., electrically isolating the load 115 from the power source 105). In at least some examples, the turn-off circuitry 120 controls the transistor 125 to rapidly turn off by discharging a gate terminal of the transistor 125 to a ground terminal. In some examples, the gate terminal of the transistor 125 is discharged to the ground terminal via a second FET (not shown) of the turn-off circuitry 120, and in some examples the discharging is through a resistor (not shown) whose resistance value at least partially determines an amount of time over which the discharging of the gate terminal of the transistor 125 occurs.

In at least some examples, the circuit 110 is implemented as, or as a component of, a battery gauge monitor (e.g., such as a single or multi-cell battery gauge monitor) or other battery management circuit. In such examples, the circuit 110 provides at least some advantages in the system 100 over systems in which the power source 105 is coupled to the load 115 without first passing through a circuit such as the circuit 110. For example, the circuit 110 includes and provides one or more monitoring functions for the power source 105 that benefit the system 100 in various ways, as discussed in greater detail herein. For example, the circuit 110 monitors any one or more of a current output of the power source 105, a voltage output by the power source 105, a temperature of the power source 105, monitors and/or controls charging of the power source 105, and or monitors the provision of power to the load 115. Based on the monitoring, the circuit 110 exerts at least some degree of control over the system 100, such as to prevent damage and/or undesirable performance of one or more components of the system 100. For example, when one or more conditions determined by the circuit 110 have a possibility to degrade performance of the system 100, degrade a user experience of a user using the system 100, damage the system 100, and/or create a risk of injury for the user using the system 100, the circuit 110 advantageously controls at least some aspects of the system 100 to mitigate the one or more determined conditions.

Figure 2:
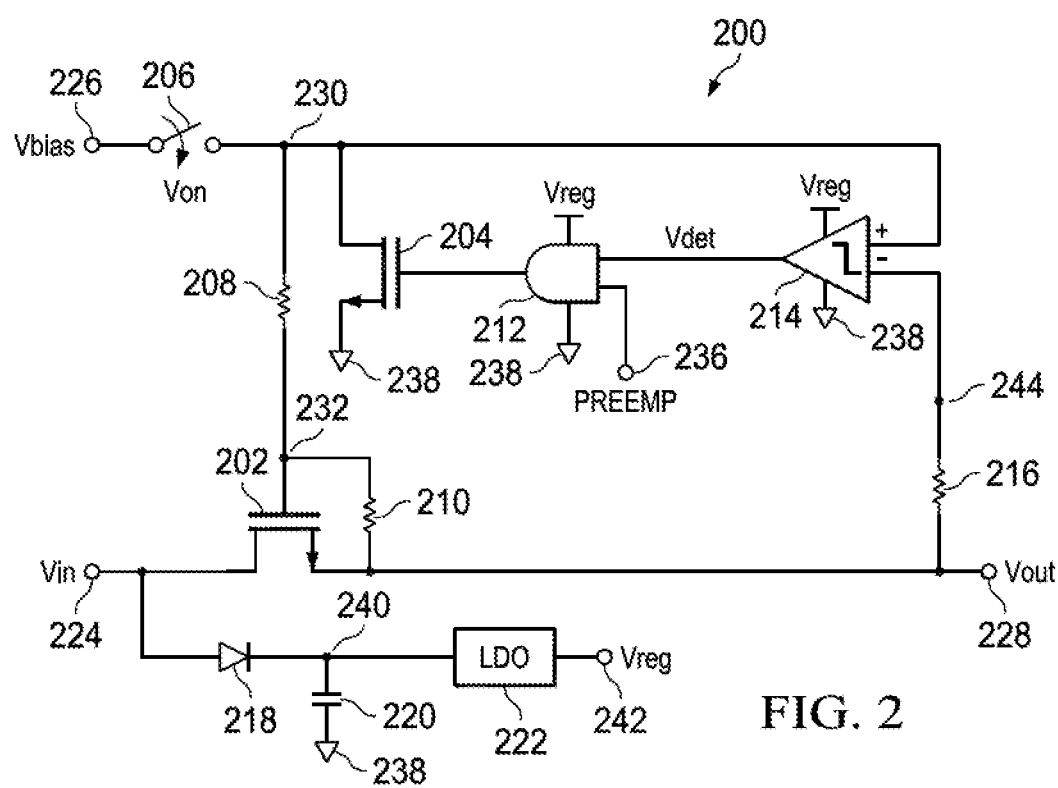
FIG. 2 shows a schematic diagram of an illustrative circuit in accordance with various examples.

Turning now to FIG. 2, a schematic diagram of a circuit 200 is shown. In at least some examples, the circuit 200 is suitable for implementation as the turn-off circuitry 120 of the circuit 110 of the system 100 of FIG. 1. In at least some examples, the circuit 200 includes a nFET 202, a nFET 204, a switch 206, a resistor 208, a resistor 210, a logical AND circuit 212, a comparator 214, and a resistor 216. In some examples, the circuit 200 further includes a diode 218, a capacitor 220, and a low-dropout regulator (LDO) 222. In some examples, the switch 206 is any suitable switching device (e.g., transistor, relay, etc.) configured to receive, and be controlled by, a control signal (Von). In some examples, the logical AND circuit 212 is a digital logic AND gate, while in other examples the logical AND circuit 212 is any suitable digital and/or analog circuitry that performs logical AND determination (e.g., such as a combination of logical circuit that individually perform operations other than a logical AND operation but when combined perform a logical AND operation). In some examples, the nFET 202 corresponds to the transistor 125 of the circuit 110 of FIG. 1, and is representative of any combination of nFET devices coupled in series and/or parallel. While illustrated as a component of the circuit 200, in at least some examples, the nFET 202 is instead a component of another circuit (not shown) and is coupled to the circuit 200, while in other examples the nFET 202 is a component of both the circuit 200 and another circuit (not shown), such as a component of both the circuit 200 and a power converter (e.g., buck converter, boost converter, or buck-boost converter). Additionally, in at least some examples the nFET 204 is a drain-extended nFET. Further, in some examples the diode 218 may be omitted and replaced by any suitable controlled switching device capable of electrically isolating the node 240 from the node 224 based on a received control signal (e.g., such as received from the controller that provides Von and Preemp).

In an example architecture of the circuit 200, the nFET 202 has a drain terminal coupled to a node 224, a source terminal coupled to a node 228, and a gate terminal coupled to a node 232. The nFET 204 has a drain terminal coupled to a node 230, a source terminal coupled to a ground terminal 238, and a gate terminal coupled to an output of the logical AND circuit 212. The switch 206 is coupled between a node 226 and a node 230, the resistor 208 is coupled between the node 230 and the node 232, and the resistor 210 is coupled between the node 232 and the node 228. In at least some examples, the resistor 208 and/or the resistor 210 are not components of the circuit 200 but are instead configured to couple to the circuit 200, for example, such that the resistor 208 and/or the resistor 210 is added to the circuit 200 by a user. The logical AND circuit 212 has a first terminal coupled to an output of the comparator 214 and a second input coupled to a node 236. The comparator 214 has a first input coupled to the node 230 and the resistor 216 is coupled between the node 228 and a second input of the comparator 214. In at least some examples, the logical AND circuit 212 and the comparator 214 are each coupled to the ground terminal 238 and are configured to receive a regulated voltage (Vreg). In at least some examples, the circuit 200 is configured to receive an input voltage (Vin) at node 224 and provide Vout at node 228.

In at least some examples, an anode of the diode 218 is coupled to the node 224 and a cathode of the diode 218 is coupled to a node 240. The capacitor 220 is coupled between the node 240 and the ground terminal 238. An input of the LDO 222 is coupled to the node 240 and an output of the LDO 222 is coupled to a node 242. In some examples, the node 242 is coupled to the logical AND circuit 212 and/or the comparator 214 to provide Vreg to the logical AND circuit 212 and/or the comparator 214. While illustrated as components of the circuit 200, in at least some examples the diode 218, the capacitor 220, and/or the LDO 222 are instead components of another circuit (not shown) and are configured to couple to the circuit 200.

In an example of operation of the circuit 200, the nFET 202 is configured to electrically couple the node 224 to the node 228 based on a value of a signal present at the node 232. When the signal present at the node 232 has a value sufficiently larger than a value of a signal present at node 228, the nFET 202 conducts between its source and drain terminals, electrically coupling the node 224 to the node 228. To provide the signal present at node 232, Vbias is received at the node 226 and switched to the node 230 by the switch 206. The signal present at node 230 is then passed to node 232 minus a voltage drop associated with the resistor 208. Vbias, in at least some examples, has a value greater than that of Vin and of Vout. Vbias is received, in some examples, from a component external to the circuit 200, while in other examples the circuit 200 includes bias generation circuitry (not shown) configured to generate Vbias (e.g., such as a charge pump, boost converter, voltage bootstrap circuitry, or any other circuitry suitable for generating Vbias, such as from Vin, with a value greater than a value of Vin and Vout). In some examples, the switch 206 is configured to receive Von from a controller (not shown) and electrically couple the node 226 to the node 230 when Von has a logical high value. When Von has a logical low value, the switch 206 decouples the node 226 from the node 230.

The comparator 214 monitors a value of Vbias with respect to a value of a signal present at node 244, which is determined according to a value of Vout minus a voltage drop associated with the resistor 216. When the value of Vbias exceeds the value of the signal present at node 244, the comparator 214 outputs a logical high signal and when the value of Vbias is less than the value of the signal present at node 244, the comparator 214 outputs a logical low value. When a load coupled to the node 228 experiences a short condition, or a power source coupled to the node 224 experiences an over-current condition, in at least some examples the value of the signal present at node 244 decreases as a result of increased voltage drop across the resistor 216 caused by an increase in a current associated with Vout. In at least some examples, inclusion of the resistor 216 in the circuit 200 is advantageous to protect against noise, electrostatic discharge (ESD), or other volatility in a signal present at node 228 and prevents shorting of node 230 directly to node 228 to turn off the nFET 202. However, in some examples, the resistor 216 is omitted from the circuit 200 such that the node 244 is coupled to the node 228 and Vout is present at the node 244 without a voltage drop associated with the resistor 216.

The logical AND circuit 212 receives the output of the comparator 214 and, when both the output of the comparator 214 and a pre-emphasis signal (Preemp) received at node 236 are logical high signals, outputs a logical high signal. Otherwise, the logical AND circuit 212 outputs a logical low signal. Preemp, in some examples, is received at node 236 from the controller (not shown) and has a rising edge following a falling edge of Von and remains at a logical high value for a predetermined period of time (e.g., such as about 50 microseconds). In at least some examples, a duration of time that Preemp has a logical high value is determined at least partially according to a gate capacitance of the nFET 202 and/or a resistance of the resistor 208 (e.g., such that the gate capacitance of the nFET 202 and the resistance of the resistor 208 define a minimum amount of time for Preemp to have a logical high value). The controller, in some examples, monitors node 228, a load coupled to node 228, node 224, a power source coupled to node 224, and/or a sense element (not shown) for a short condition of the load coupled to node 228 and/or an over-current condition of the power source coupled to node 224 and generates and provides Von and Preemp based at least partially on that monitoring.

When the output of the logical AND circuit 212 is a logical high value, a voltage differential between gate and source terminals of the nFET 204 is sufficiently large to cause the nFET 204 to conduct between its source and drain terminals, coupling the node 230 to the ground terminal 238. When the node 230 is coupled to the ground terminal 238 and the switch 206 is open, node 230 and node 232 discharge to the ground terminal 238 through the resistor 208 and the nFET 204. In at least some examples, the resistor 208 has a resistance much less than a resistance of the resistor 210. For example, the resistor 210 has a resistance of about 10 megaohms and the resistor 208 has a resistance of less than 1000 ohms. In at least some examples, the smaller the resistance of the resistor 208, the faster that the node 232 discharges to the ground terminal 238. For example, with a resistance of the resistor 208 of about 10 ohms, the node 232 discharges to the ground terminal 238 and the nFET 202 turns off in less than about 2 microseconds. In another example, with a resistance of the resistor 208 of about 500 ohms, the node 232 discharges to the ground terminal 238 and the nFET 202 turns off in less than about 30 microseconds. In at least some examples, the faster that the nFET 202 is turned off, the more inductive noise and/or ringing that can be introduced to the circuit 200. Accordingly, in at least some examples a value of resistance of the resistor 208 is adjustable, programmable, or otherwise modifiable such that a user can program and/or trim the circuit 200 to provide a desired combination of duration of time for turning off the nFET 202 and inductive ringing in the circuit 200 resulting from turning off the nFET 202. Introduction of the resistor 208 in series with the gate terminal of the nFET 202, in at least some examples, is advantageous in providing greater flexibility of application of the circuit 200, enabling a duration of time for turning off the nFET 202 to be controlled according to desired performance and trade-offs between inductive ringing and speed.

When a load coupled to the node 228 experiences a short condition, in some examples, the short condition is sufficient to cause temporary variation in a voltage and/or current Vin as present at node 224 while the nFET 202 is conducting. When the nFET 202 is turned-off by the nFET 204, the voltage present at node 224 recovers to a value approximately equal to what was present at node 224 prior to the load experiencing the short condition. However, for the nFET 204 to turn off the nFET 202, the logical AND circuit 212 and the comparator 214 require Vreg for operation. In at least some examples, the LDO 222 generates Vreg based at least partially on Vin and variation in the voltage present at node 224 causes variation in Vreg, in some circumstances to the extent of disabling functionality of the logical AND circuit 212 and/or the comparator 214. To maintain the ability of the LDO 222 to provide Vreg at an expected value to the logical AND circuit 212 and the comparator 214, in some examples the diode 218 and the capacitor 220 operate to hold an input signal to the LDO 222 for a sufficient period of time for the nFET 204 to turn off the nFET 202 and permit the node 224 to recover to the value approximately equal to what was present at node 224 prior to the load experiencing the short condition. For example, the capacitor 220 discharges to the LDO 222 and the diode 218 prevents the energy discharging from the capacitor 220 from discharging to the node 224, enabling the LDO 222 to continue providing Vreg based on energy stored in the capacitor 220 until the node 224 recovers to the value approximately equal to what was present at node 224 prior to the load experiencing the short condition.

In at least some examples, the nFET 204 rapidly discharging the voltage present at the node 232 is advantageous in protecting the nFET 202, and/or a power source coupled to the node 224, from damage when a value of the signal present at the node 244 decreases below Vbias that might otherwise result from discharging the node 232 through another, slower approach. Similarly, use of the nFET 204 is further advantageous because the nFET 204, in at least some examples, provides for a smallest amount of series resistance when the nFET 204 is turned on of presently available standard transistor technology, creating a very low impedance path to ground and facilitating the rapid discharge of the node 232 as discussed above.

Figure 3:
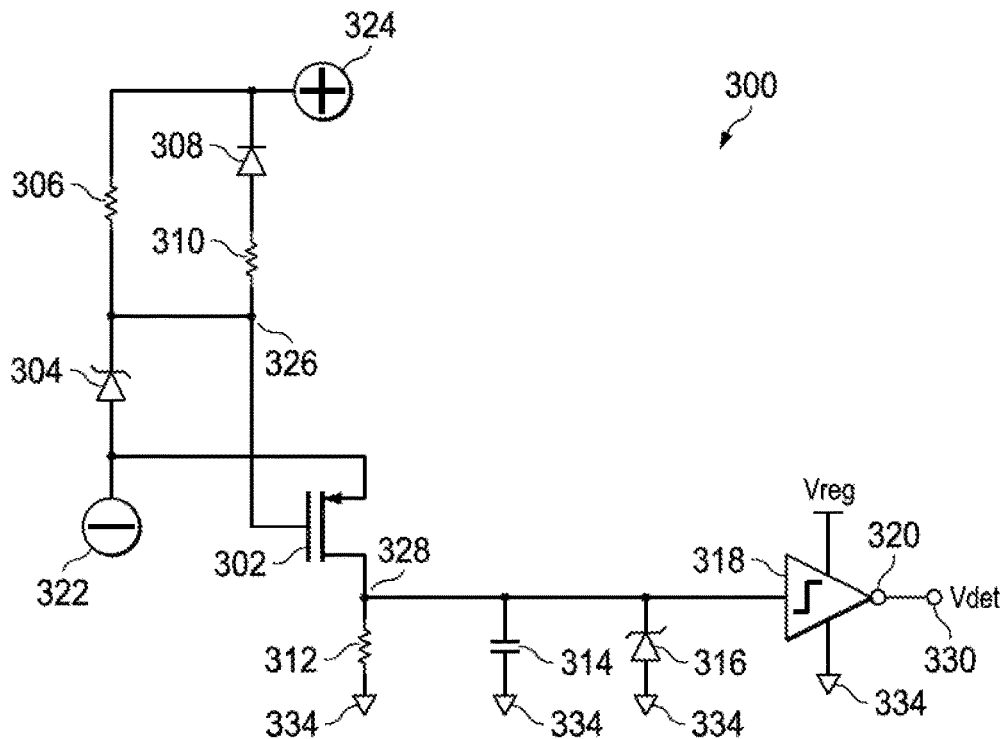
FIG. 3 shows a schematic diagram of an illustrative circuit in accordance with various examples.

Turning now to FIG. 3, a schematic diagram of a circuit 300 is shown. In at least some examples, the circuit 300 is suitable for implementation as the comparator 214 of the circuit 200 of FIG. 2. In other examples, the circuit 300 is suitable for implementation in any environment in which it may be desirable to rapidly compare two signals and output a result of that comparison. In some examples, the circuit 300 includes a pFET 302, a Zener diode 304, a resistor 306, a diode 308, a resistor 310, a resistor 312, a capacitor 314, a Zener diode 316, a Schmitt trigger 318, and an inverter 320. In at least some examples the pFET 302 is a drain-extended pFET. In some examples, the Schmitt trigger 318 is omitted and is instead replaced by any suitable component, such as an amplifier. In at least some examples, the circuit architecture of the circuit 300 is advantageous over other circuits functioning as a comparator in providing a high-speed from input signal change to output signal determination while having a minimal component cost and circuit complexity through a pull to ground control scheme, as discussed in greater detail below, such as with respect to the PFET 302 and the resistor 312.

In an example architecture of the circuit 300, the pFET 302 has a drain terminal coupled to a node 328, a source terminal coupled to a node 322, and a gate terminal coupled to a node 326. The Zener diode 304 has an anode coupled to the node 322 and a cathode coupled to the node 326. The resistor 306 is coupled between the node 326 and a node 324. The diode 308 has a cathode coupled to the node 324 and the resistor 310 is coupled between an anode of the diode 308 and the node 326. The resistor 312 and the capacitor 314 are each coupled between the node 328 and a ground terminal 334. The Zener diode 316 has an anode coupled to the ground terminal 334 and a cathode coupled to the node 328. The Schmitt trigger 318 has an input coupled to the node 328 and the inverter 320 is coupled in series between an output of the Schmitt trigger 318 and a node 330. In at least some examples, the Schmitt trigger 318 is configured to receive Vreg and is coupled to the ground terminal 334. In at least some examples, the circuit 300 is configured to receive a first signal for comparison at node 324 and receive a second signal for comparison at node 322. For example, when viewing the circuit 300 as a comparator having an output at node 330, the node 322 is an inverting input of the circuit 300 (and therefore the comparator) and the node 324 is a non-inverting input of the circuit 300 (and therefore the comparator). In some implementations the circuit 300 receives a Vbias (or a switched version of Vbias) at the node 324 and the node 322 receives Vout, or a signal based at least partially on Vout.

In an example of operation of the circuit 300, when the signal present at the node 324 has a value less than the value of the signal present at node 322, the pFET 302 is biased to cause the pFET 302 to begin conducting between its source and drain terminals, coupling the node 322 to the node 328. A current flowing through the pFET 302 flows through the resistor 312, creating a voltage at the node 328 that triggers the Schmitt trigger 318 to output a logical high signal that is inverted by the inverter 320 to generate a detection signal (Vdet) having a logical low value and provide Vdet at the node 330. When the signal present at node 324 has a value greater than the value of the signal present at node 322, the pFET 302 stops conducting, and the Schmitt trigger 318 outputs a logical low signal that is inverted by the inverter 320 to generate Vdet having a logical high value and provide Vdet at node 330. In at least some examples, the resistor 312 and the capacitor 314 form an resistor-capacitor (RC) timer to mitigate effects of noise spiked on activation of the Schmitt trigger 318. For example, the capacitor 314 has a small, but non-zero (e.g., about 100 femtofarad), capacitance such that the resistor 312 and the capacitor 314 have a small time constant. Additionally, the Zener diode 316 clamps a voltage present at node 328 to a breakdown voltage of the Zener diode 316 to protect the Schmitt trigger 318 from damage resulting from over-voltage.

In at least some examples, the Zener diode 304 clamps a voltage present at node 326 to a breakdown voltage of the Zener diode 304 to protect the pFET 302 from damage. For example, when the signal present at node 324 is much greater in value than the signal present at node 322, the Zener diode 304 limits a voltage present at the node 326 to the breakdown voltage of the Zener diode 304 and the resistor 306 limits a current flowing through the Zener diode 304. For example, in at least some implementations the resistor 306 has a comparatively large resistance (e.g., such as about 10 megaohms) to cause a current flowing through the resistor 306 to be comparatively small (e.g., such as in a range of nanoamps). The diode 308 and the resistor 310, in at least some examples, provide a path for shorting around the resistor 306. For example, when the value of the signal present at the node 324 is less than the value of the signal present at node 322, the diode 308 and the resistor 310 provide a low impedance path to node 326 to quickly turn on the pFET 302. In at least some examples, the resistor 310 has a resistance one or more orders of magnitude less than a resistance of the resistor 306. For example, when the resistor 306 has a resistance of about 10 megaohms, the resistor 310 has a resistance of about 1 kiloohm.

Figure 4:
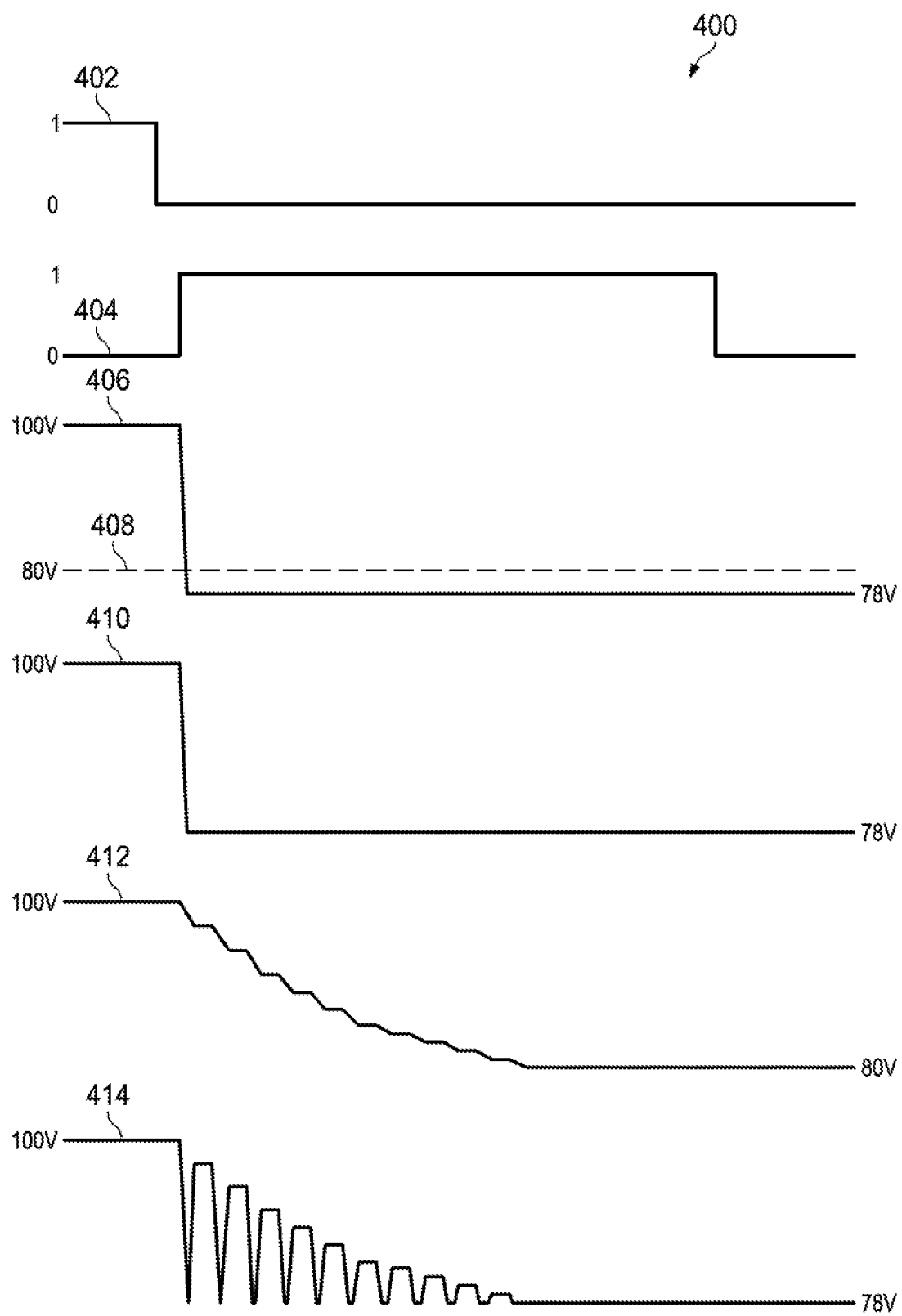
FIG. 4 shows a diagram of illustrative waveforms in accordance with various examples.

Turning now to FIG. 4, a diagram 400 of illustrative waveforms is shown. In at least some examples, the diagram 400 is illustrative of waveforms corresponding to signals present in the circuit 200. In an example of the circuit 200, the waveform 402 is representative of Von, the waveform 404 is representative of the signal present at node 232 for a first example case, the waveform 406 is representative of Preemp, the waveform 408 is representative of the signal present at node 228 for the first example case, the waveform 410 is representative of the signal present at node 230 for the first example case, the waveform 412 is representative of the signal present at node 232 for a second example case, and the waveform 414 is representative of the signal present at node 230 for the second example case. The waveform 402 and the waveform 404 are represented in a horizontal direction by time in microseconds and are represented in a vertical direction by logical values, where a "1" is a logical high value and a "0" is a logical low value. The waveform 406, waveform 408, waveform 410, waveform 412, and waveform 414 are represented in a horizontal direction by time in microseconds and in a vertical direction by voltage in volts (v). Additionally, while certain signal are shown in FIG. 4 as having particular values, (e.g., 100 V, 80V, 78V) such values are merely exemplary and do not limit the present disclosure to only those values.

As discussed above, an amount of time for discharging node 232 and node 230 is at least partially determined according to a resistance of the resistor 208. The amount of time for discharging node 232 and node 230 is also at least partially dependent on a gate capacitance of the nFET 202. The first example case represented in diagram 400 corresponds to a gate capacitance of the nFET 202 of about 40 nanofarads and a resistance of the resistor 208 of about 10 ohms and the second example case represented in diagram 400 corresponds to a gate capacitance of the nFET 202 of about 40 nanofarads and a resistance of the resistor 208 of about 500 ohms.

As illustrated by waveform 402 and waveform 404, after Von transitions to a logical low (e.g., as a result of a controller determining a short condition of a load or an over-current condition of a power source) a Preemp signal received from the controller transitions to a logical high for a predefined period of time. As shown by waveform 406, waveform 408, and waveform 410, when Vbias is greater than Vout, Preemp is high, and the resistance of the resistor 208 is small, Vbias, and therefore the signal present at node 232, decrease until Vbias, and the signal present at node 232, are slightly less than Vout. In at least some examples, Vbias and the signal present at node 232 decrease to a value less than Vout, where the value is determined at least partially according to a threshold voltage of the pFET 302, a forward voltage of the diode 308, and a voltage drop of the resistor 310. In at least some examples, such as when operating at room temperature, the value is about 2 volts less than Vout.

Similarly, as shown by waveform 412 and waveform 414, when Vbias is greater than Vout, Preemp is high, and the resistance of the resistor 208 is larger in size, Vbias, and therefore the signal present at node 232, decrease more slowly that in the first example case. For example, because of the increased resistance of the resistor 208 in the second example case, the gate capacitance of the nFET 202 discharges more slowly. Therefore, when node 230 (e.g., the node at which Vbias is present) is coupled to the ground terminal 238, the signal present at node 232 decreases slowly as the gate capacitance of the nFET 202 discharges through the resistor 208 and nFET 204 to the ground terminal 238. When node 230 decreases in value below Vout, the comparator 214 outputs a logical low signal, turning off the nFET 204. During this time, the signal present at node 232 is imparted on node 230 via charge sharing, as shown by the waveform 412, which in turn activates the comparator 214 again to output a logical high signal and the process repeats until the gate capacitance of the nFET 202, node 232, and node 230 are all fully discharged. In this way, by increasing the resistance of the resistor 208, an amount of time for the gate capacitance of the nFET 202 to discharge is increased, increasing an amount of time for turning off the nFET 202 and at least partially mitigating the creation of inductive noise and/or ringing in the circuit 200 as a result of turning off the nFET 202.

Figure 5:
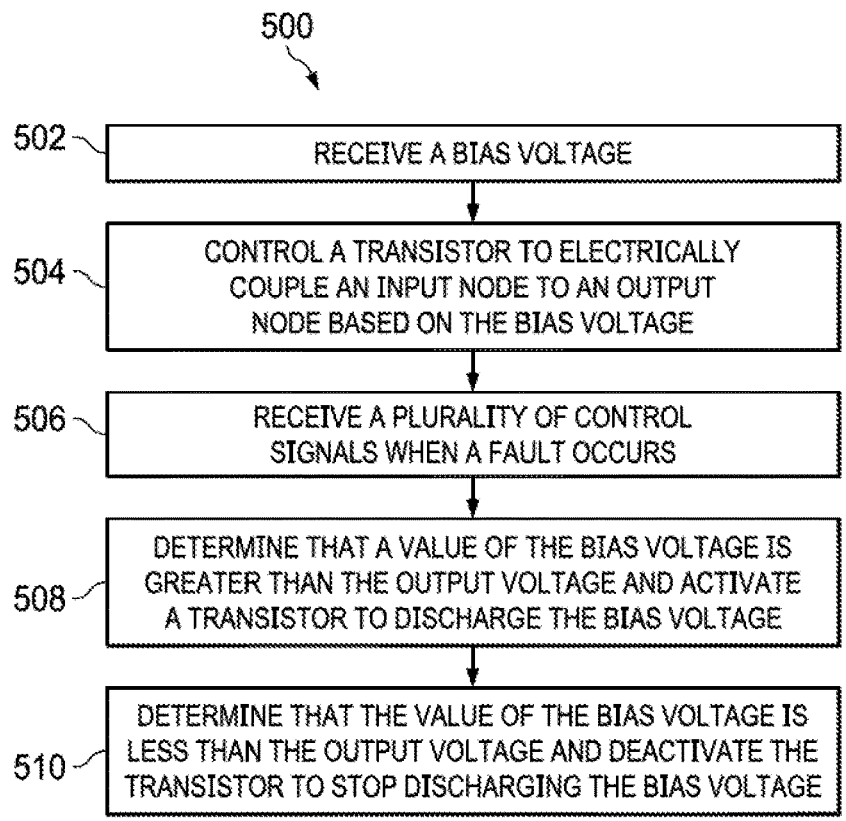
FIG. 5 shows a flowchart of an illustrative method in accordance with various examples.

Turning now to FIG. 5, a flowchart of an illustrative method 500 is shown. In at least some examples, the method 500 is representative of operation of the circuit 200 and/or the circuit 300, or a combination of operation of the circuit 200 and the circuit 300, for example, to rapidly turn off a switch, as discussed herein.

At operation 502, a bias voltage is received by a circuit. In at least some examples, the bias voltage is received from another component that generates the bias voltage. In other examples, the bias voltage is generated by a component of the circuit, such as a charge pump. At operation 504, the circuit controls a transistor to electrically couple an input node to an output node based on the bias voltage. In at least some examples, the circuit controls the transistor to electrically couple the input node to the output node when the bias voltage is greater than an output voltage of the circuit.

At operation 506, a fault occurs and the circuit receives a plurality of control signals. In some examples, the fault is a short condition of a load coupled to the circuit. In other examples, the fault is an over-current condition of a power source coupled to the circuit. The plurality of control signals includes, for example, Von and Preemp.

At operation 508, the circuit determines that a value of the bias voltage is greater than the output voltage of the circuit and activates a transistor to discharge the bias voltage. In at least some examples, the circuit activates the transistor to discharge the bias voltage by comparing the bias voltage to the output voltage of the circuit and outputting a logical high signal when the bias voltage is greater than the output voltage of the circuit. The result of the comparison is combined in a logical AND operation with Preemp and a result of the logical AND operation drives the transistor to discharge the bias voltage.

At operation 510, the circuit determines that the bias voltage is less than the output voltage of the circuit and deactivates the transistor to stop discharging the bias voltage. In at least some examples, the circuit deactivates the transistor by comparing the bias voltage to the output voltage of the circuit (e.g., via a comparator) and outputting a logical low signal when the bias voltage is less than the output voltage of the circuit.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground terminal" the foregoing discussion are intended to indicate a terminal that is configured to couple to a ground potential, including a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
a switch coupled between a first node and a second node;
a first transistor having a first gate, a first drain coupled to the second node, and a first source coupled to a ground terminal;
a logic gate having a first logic input, a second logic input coupled to a third node, and a logic output coupled to the first gate;
a comparator having a first comparator input coupled to the second node, a second comparator input coupled to a fourth node, and a comparator output coupled to the first logic input;
a second transistor having a second gate, a second drain, and a second source, the second gate coupled to the second node; and
a resistor coupled between the second comparator input and the second source.

2. The circuit of claim 1, wherein the resistor is a first resistor, the circuit further comprising a second resistor having a first resistor terminal and a second resistor terminal, the first resistor terminal coupled to the fourth node and the second resistor terminal coupled to the second gate.

3. The circuit of claim 1, wherein the resistor is a first resistor, the circuit further comprising a second resistor coupled between the second node and the second gate.

4. The circuit of claim 1, further comprising:
a diode having an anode coupled to a sixth node and a cathode coupled to a seventh node;
a capacitor coupled between the seventh node and the ground terminal; and
a regulator having a regulator input coupled to the seventh node and a regulator output coupled to an eighth node, wherein a supply terminal of the logic gate is coupled to the eighth node, and wherein a supply terminal of the comparator is coupled to the eighth node.

5. The circuit of claim 1, wherein the comparator comprises:
a third transistor having a third gate coupled to a ninth node, a third source coupled to the fourth node, and a third drain coupled to a tenth node;
a fourth resistor coupled between the tenth node and the ground terminal;
a Zener diode having a first anode coupled to the fourth node and a first cathode coupled to the ninth node;
a fifth resistor coupled between the ninth node and the second node;
a second diode having a second cathode coupled to the second node and a second anode;
a sixth resistor coupled between the second anode and the ninth node;
a Schmitt trigger having a trigger input coupled to the tenth node and a trigger output; and
an inverter coupled between the trigger output and the comparator output, wherein a supply terminal of the Schmitt trigger is coupled to an eighth node.

6. The circuit of claim 5, wherein the comparator further comprises:
a second capacitor coupled between the tenth node and the ground terminal; and
a second Zener diode coupled between the tenth node and the ground terminal.

7. The circuit of claim 1, wherein the third node is configured to receive a pre-emphasis signal from a controller, and wherein the switch is controlled by a control signal received from the controller.

8. A system, comprising:
a power source coupled to a first node;
a load coupled to a second node;
a first transistor having a first gate coupled to a third node, a first drain coupled to the first node, and a first source coupled to the second node;
turn-off circuitry coupled to the first gate of the first transistor, the turn-off circuitry comprising:
a second transistor having a second gate, a second drain, and a second source, the second drain coupled to the first gate and the second source coupled to a ground terminal;
a logic gate having a logic output, a first logic input, and a second logic input, the logic output coupled to the second gate;
a comparator having a comparator output, a first comparator input, and a second comparator input, the comparator output coupled to the first logic input and the first comparator input coupled to the second drain; and
a resistor coupled between the second comparator input and the first source; and
a controller coupled to the second logic input.

9. The system of claim 8, wherein the resistor is a first resistor, and wherein the turn-off circuitry further comprises:
a second resistor coupled between the first gate and the first source;
a third resistor coupled between the first gate and the second drain; and
a switch coupled to the second drain, the switch having a control terminal coupled to the controller.

10. The system of claim 9, wherein the comparator comprises:
a p-type FET (pFET) having a third gate coupled to a sixth node, a third source coupled to the second comparator input, and a third drain coupled to a seventh node;
a fourth resistor coupled between the seventh node and the ground terminal;
a first Zener diode having a first anode coupled to the second node and a first cathode coupled to the sixth node;
a fifth resistor coupled to the sixth node;
a diode having a second cathode coupled to the fifth resistor and a second anode;
a sixth resistor coupled between the second anode and the sixth node;
a Schmitt trigger having a trigger input coupled to the seventh node and a trigger output; and
an inverter coupled between the trigger output and the comparator output.

11. The system of claim 10, wherein the comparator further comprises:
a capacitor coupled between the seventh node and the ground terminal; and
a second Zener diode coupled between the seventh node and the ground terminal.

12. The system of claim 10, wherein the turn-off circuitry further comprises:
a second diode having a third anode coupled to the first node and a third cathode coupled to an eighth node;
a capacitor coupled between the eighth node and the ground terminal; and
a regulator having a regulator input coupled to the eighth node and a regulator output coupled to a supply terminal of the logic gate and a supply terminal of the Schmitt trigger.

13. The system of claim 9, wherein the switch is configured to receive a bias voltage.

14. The system of claim 8, wherein the controller configured to instruct the turn-off circuitry to turn off the first transistor responsive to detecting a fault in the system.

15. The system of claim 14, wherein the fault is a short condition of the load or an over-current condition of the battery power source.

16. A circuit comprising:
a first input terminal;
a second input terminal;
a transistor having a drain, a source, and a gate, the source coupled to the first input terminal and the gate coupled to an intermediate node;
a Zener diode coupled between the first input terminal and the intermediate node;
a first resistor having a first resistor terminal and a second resistor terminal, the first resistor terminal coupled to the intermediate node;
a second resistor coupled between the intermediate node and the second input terminal; and
a diode coupled between the second resistor terminal and the second input terminal.

17. The circuit of claim 16, further comprising:
a Schmitt trigger having a trigger input and a trigger output, the trigger input coupled to the drain; and
an inverter having an inverter input and an inverter output, the inverter input coupled to the trigger output.

18. The circuit of claim 16, further comprising a third resistor having a fifth resistor terminal and a sixth resistor terminal, the fifth resistor terminal coupled to the drain and the sixth resistor terminal coupled to a ground terminal.

19. The circuit of claim 16, wherein the Zener diode is a first Zener diode, the circuit further comprising:
a capacitor having a first capacitor terminal and a second capacitor terminal, the first capacitor terminal coupled to the drain and the second capacitor terminal coupled to a ground terminal; and
a second Zener diode having a third anode and a third cathode, the third cathode coupled to the drain and the third anode coupled to the ground terminal.

* * * * *